United States Patent [19]

Shafir

[11] Patent Number: 5,316,897

[45] Date of Patent: May 31, 1994

[54] METHOD AND SYSTEM FOR APPLYING A MARKING TO A SUBSTRATE, PARTICULARLY A PAINTED BORDER ADJACENT TO AND AROUND A WINDSHIELD PLATE

[75] Inventor: Aaron Shafir, Tel Aviv, Israel

[73] Assignee: Tamglass OY, Tampiere, Finland

[21] Appl. No.: 761,159

[22] Filed: Sep. 17, 1991

Related U.S. Application Data

[63] Continuation-in-part of Ser. No. 452,471, Dec. 18, 1989, abandoned.

[30] Foreign Application Priority Data

Jan. 5, 1989 [IL] Israel ........................................ 88886
Aug. 22, 1991 [IL] Israel ........................................ 99275

[51] Int. Cl.⁵ ........................ G03C 5/04; B32B 31/00; B05C 9/08
[52] U.S. Cl. .................... 430/397; 427/595; 118/620; 118/301; 118/505; 156/275.5
[58] Field of Search ........................ 427/595; 430/5, 18, 430/22, 397; 352/129; 118/620, 504, 301, 505; 156/275.5

[56] References Cited

U.S. PATENT DOCUMENTS

| | | | |
|---|---|---|---|
| 3,984,180 | 10/1976 | Hadzimahalis | 352/146 |
| 4,591,238 | 5/1986 | Kitaoka et al. | 352/129 X |
| 4,645,318 | 2/1987 | Trumball | 352/146 |
| 4,752,352 | 6/1988 | Feygin | 156/272.8 X |
| 4,844,947 | 7/1989 | Kasner et al. | 427/53.1 |
| 4,940,641 | 7/1990 | Pavone et al. | 430/22 |
| 4,977,668 | 12/1990 | McKenzie, Jr. | 29/852 |
| 5,089,184 | 2/1992 | Hirano et al. | 156/275.5 X |
| 5,151,725 | 9/1992 | Liljegren et al. | 352/129 |

Primary Examiner—David A. Simmons
Assistant Examiner—Chester T. Barry
Attorney, Agent, or Firm—Benjamin J. Barish

[57] ABSTRACT

A method and apparatus for exposing a substrate of relatively large surface area to radiation according to a predetermined pattern recorded on a mask, particularly useful in applying a painted border to an automobile windshield, includes the steps of progressively recording the predetermined pattern on a mask in the form of a continuous strip, and moving the radiation source to progressively scan the surface of the substrate with radiation, while at the same time moving the continuous strip mask relative to the radiation source, such that portions of the pattern on the continuous strip mask progressively become aligned with their corresponding portions of the substrate as the substrate is progressively scanned by the radiation source.

16 Claims, 16 Drawing Sheets

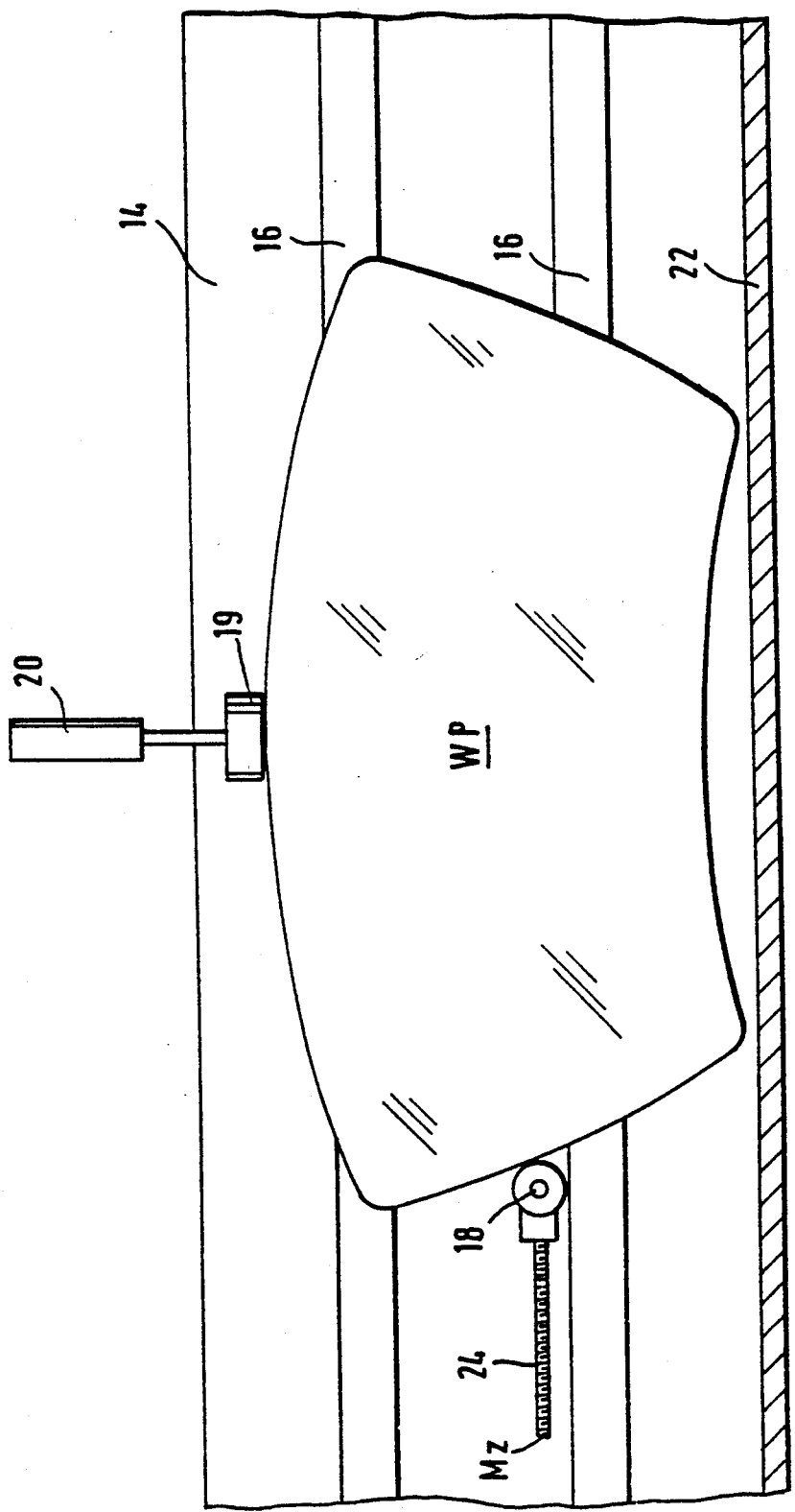

METHOD AND SYSTEM FOR APPLYING A MARKING TO A SUBSTRATE, PARTICULARLY A PAINTED BORDER ADJACENT TO AND AROUND A WINDSHIELD PLATE

RELATED APPLICATION

The present application is for a continuation-in-part of application Ser. No. 07/452,471, filed Dec. 18, 1989, now abandoned.

FIELD AND BACKGROUND OF THE INVENTION

The present invention relates to a method and system for applying a marking to a substrate. The invention is particularly useful for applying a border of opaque material adjacent to and around a windshield plate, and is therefore described below with respect to this application.

Up to recent years, the motor vehicle windshield was generally mounted to the motor vehicle body by the use of a grommet or sealing ring applied along the outer border of the windshield and received in the windshield opening of the vehicle body. The application of such a grommet to the windshield, done manually, was found difficult to automate. In recent years, this manually applied grommet has been replaced in many motor vehicles by a sealing strip covered by a painted border applied adjacent to and around the windshield. The conventional way of applying such a border of opaque material adjacent to and around the windshield is by painting through a silk-screen. Such a silk-screen process, however, is usually done manually; moreover, it requires a separate pattern or mask for each shape and size of windshield, and also requires a substantial period of time and/or a substantial quantity of material to apply the complete border.

OBJECTS AND SUMMARY OF THE INVENTION

An object of the present invention is to provide a method of applying a marking to a substrate, and particularly a painted border around a windshield, having advantages in the above respects.

Another object of the present invention is to provide a method of exposing a substrate of relatively large surface area to radiation according to a predetermined pattern recorded on a mask, which method is particularly useful in making automobile windshields.

According to one aspect of the present invention, there is provided a method of exposing a substrate of relatively large surface area to radiation according to a predetermined pattern recorded on a mask, comprising: progressively recording the predetermined pattern on a mask in the form of a continuous strip; supporting the continuous strip mask between a source of the radiation and the substrate; and effecting relative movement between the radiation source and the substrate to progressively scan the surface of the substrate with radiation, while at the same time moving the continuous strip mask relative to the radiation source, such that portions of the pattern on the continuous strip mask progressively become aligned with their corresponding portions of the substrate as the substrate is progressively scanned by the radiation source.

According to another aspect of the invention, there is provided a method of applying a marking to a substrate, comprising: (a) coating the surface of the substrate with an initial pattern, to include the precise surface to be occupied by a final predetermined pattern, with a liquid substance which, when subjected to a predetermined type of electromagnetic radiation, hardens and binds itself to the substrate; (b) exposing the precise surface of the coated substance to be occupied by the final predetermined pattern to the predetermined type of electromagnetic radiation to cause the coated substance to harden and to bind itself to the substrate; and (c) removing the portions of the coated substance not exposed to the electromagnetic radiation; characterized in that operation (b) is performed in accordance with the above-described method.

According to further features in the described preferred embodiment, the radiation source is moved relative to the substrate; in addition, the continuous strip mask is carried by the radiation source. More particularly, the continuous strip mask is progessively wound from a supply reel onto a take-up reel during the progressive scanning of the substrate with radiation.

According to further features in the described preferred embodiment, the radiation source and continuous strip mask are carried by a common head which is pivotally mounted about an axis perpendicular to the surface of the substrate to be exposed. The head is moved in a plurality of rectilinear scanning lines while the head is fixed about its pivotal axis during each such scan. The head is pivotted before starting a scanning line where the respective scanning line requires a different orientation of the head than the preceding scanning line.

A method of exposing a substrate to radiation in accordance with the above features is particularly advantageous where the substrate is of relatively large surface area, such as in the case of a vehicle windshield. Thus, the energy of the light source can be concentrated to a relatively small region of the substrate, which thereby allows very intense radiation to be used in the exposure, as compared for example in the one-shot flood-illumination technique. In addition, the mask can be embodied in a relatively compact cassette which can be conveniently replaced by another cassette mask when the pattern to be marked is to be changed.

According to further features in the described preferred embodiment, there are two of such heads located on the opposite sides of the substrate. The two heads are simultaneously operated and controlled such that each head exposes one side of the substrate with one-half of the predetermined pattern. This feature substantially decreases the time for processing the substrates, particularly automobile glass plates such as windshield plates.

The invention also provides apparatus for applying a marking to a substrate and for exposing the substrate to radiation in accordance with the above method.

The method and apparatus of the present invention thus more easily lend themselves to automation than the conventional silk-screen process, and thereby enable windshields with the border of opaque material, to be produced in volume, at lower cost, and with less manual input, than the present conventional silk-screen process.

Further features and advantages of the invention will be apparent from the description below.

BRIEF DESCRIPTION OF THE DRAWINGS

The invention is herein described, by way of example only, with reference to the accompanying drawings, wherein:

FIG. 4 is an enlarged fragmentary view illustrating the positioning device in the coating machine, a similar positioning device being also included in the radiation-exposing machine;

DESCRIPTION OF PREFERRED EMBODIMENTS

Overall System

Figure 1:
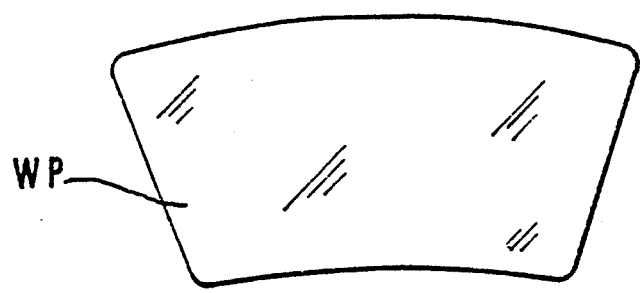
FIGS. 1 and 1a-1c illustrate four stages in the method of applying a border of opaque material adjacent to and around a windshield plate in accordance with the present invention.

With reference first to FIGS. 1 and 1a-1c, these figures illustrate the various stages in producing a plate having a border of opaque material applied adjacent to and around its outer edge in accordance with the present invention, which plate is to be subsequently used for making a windshield. Thus, FIG. 1 illustrates the windshield plate, therein designated WP, after it has been cut and ground to proper size and configuration but before the painted border has been applied adjacent to and around its outer edge. As described earlier, such a border of opaque material, presently applied by a silk-screen technique, is used to cover the seal which bonds the windshield to the vehicle body.

Figure 1A:
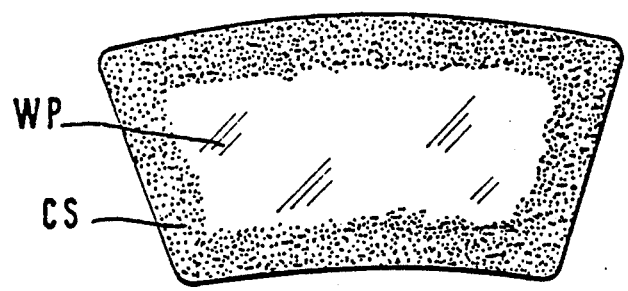
Figure 1B:
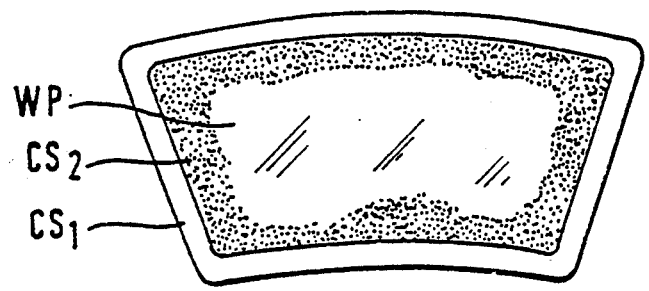
Figure 1C:
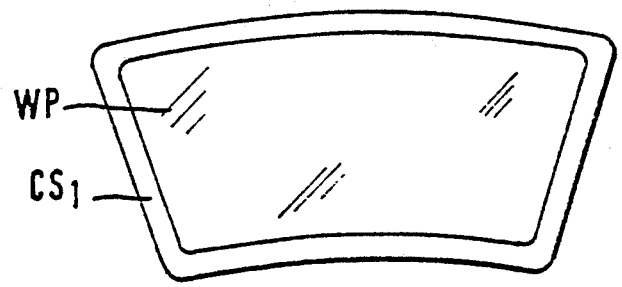

In accordance with the present invention, this border of opaque material is applied in the following manner as illustrated in FIGS. 1a-1c, respectively.

As shown in FIG. 1a, the general surface of the windshield plate adjacent to and around its outer edge, including the precise surface to be occupied by the border of opaque material, is coated with a liquid substance, as shown at CS, which, when subjected to a specific type of electromagnetic radiation, e.g., ultraviolet or infrared radiation, hardens and binds itself to the windshield plate WP. Such a coating may be applied imprecisely so long as it completely coats at least the precise surface to be occupied by the painted border.

The precise surface of the windshield plate WP to be occupied by the border of opaque material is then exposed to the selected type of electromagnetic radiation, e.g., ultraviolet light, as shown in FIG. 1b; this causes the coated substance CS to harden along this precise border, indicated at $CS_1$, and to bind itself to the windshield plate. The remaining portion of the coated substance not exposed to the electromagnetic radiation, indicated as $CS_2$, does not harden nor bind itself to the windshield plate.

The next operation, as shown in FIG. 1c, is to remove, by washing away, the portions of the coated substance (portion $CS_2$ of FIG. 1b) which had not been exposed to the electromagnetic radiation, thereby leaving the coated substance $CS_1$ which had been exposed, and which as a consequence had hardened and had become bonded to the windshield plate.

Figure 2:
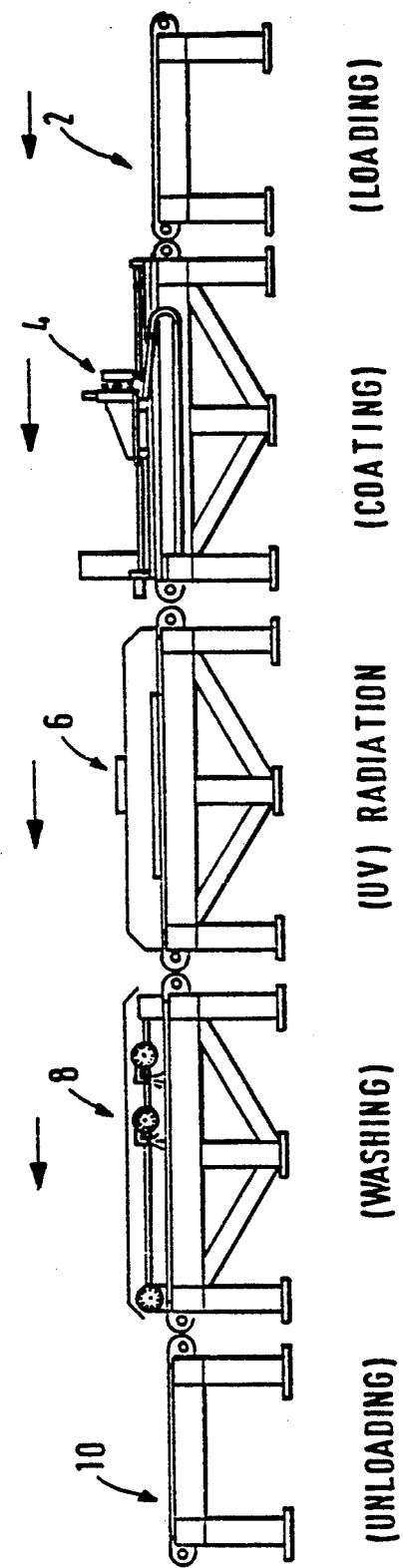
FIG. 2 illustrates an overall system for applying a border of opaque material adjacent to and around a windshield plate in accordance with the method of FIGS. 1 and 1a-1c.

FIG. 2 illustrates a system which may be used for performing the above-described operations illustrated in FIGS. 1a-1c. Briefly, the system comprises a loader 2 on which the windshield plates WP are initially loaded, a coating machine 4 for performing the coating operation described above with respect to FIG. 1a; a radiation machine 6 for performing the radiation-exposing operation as described above with respect to FIG. 1b; a washing machine 8 for performing the washing operation as described above with respect to FIG. 1c; and an unloader 10 for unloading the windshield plates with the border of opaque material applied around its outer edge, as illustrated in FIG. 1c. Each of the above machines includes conveyor belts under the control of a computer for automatically feeding the windshield plate from one machine to the next and for automatically controlling the coating, exposing and washing operations.

The Coating Machine

The coating machine 4, as shown in FIGS. 3a-3c and 4, includes a base 12 supporting a horizontal table 14 which receive the windshield plates to be coated by the machine. A pair of conveyor belts 16 (FIG. 4) pass over the upper surface of table 14 to convey each windshield plate to a coating station on the table as defined by the position of a roller 18 engageable with the leading edge of the windshield plate WP when fed by the conveyor belts 16. When the windshield plate WP is properly positioned in the coating station by roller 18, preferably in the center of table 14, it is clamped in this position by means of a piston 19 movable with respect to a cylinder 20 and engageable with the upper surface of the windshield plate to press it against a wall 22 at the opposite side of the table.

Roller 18 is selectively positionable to the proper location, according to the particular size and configuration of the windshield plate being processed, by a feed screw 24 which may be automatically controlled as will be described below. Wall 22 engageable with the lower end of the windshield plate WP is preferably made of a suitable plastic material, such as "Teflon" (Reg. T.M.).

A carriage 26, in the form of a gantry bridge, is mounted over the upper face of horizontal table 14 and is movable along the X-axis, i.e., longitudinally of the table. Another carriage 28 is supported by carriage 26 and is movable along the Y-axis, i.e., transversely of the table. The Y-axis carriage 28 carries a sprayer head 30 overlying the upper face of the table and selectively positionable at any point with respect to it by selectively moving the X-axis carriage 26 and Y-axis carriage 28.

Figure 3A:
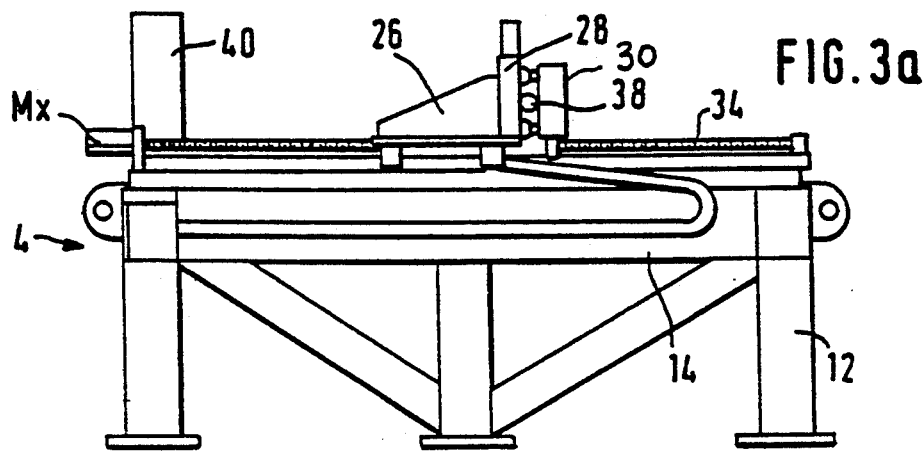
FIGS. 3a, 3b and 3c are side, end and plan views respectively, illustrating the coating machine in the system of FIG. 2.
Figure 3B:
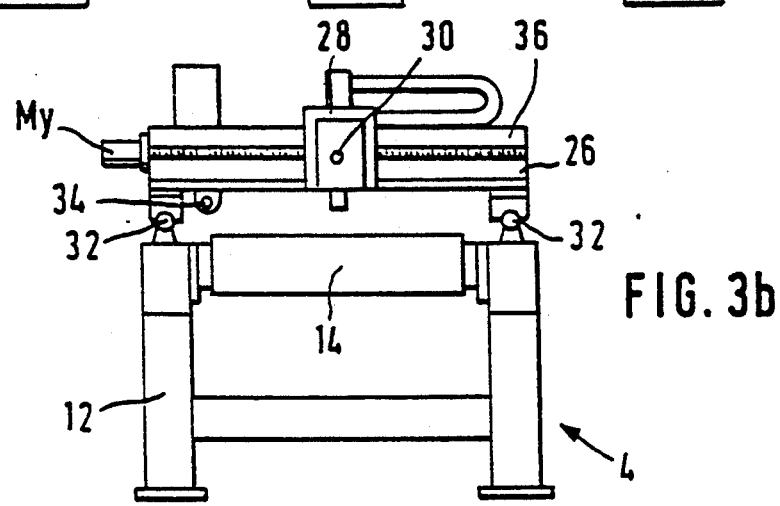
Figure 3C:
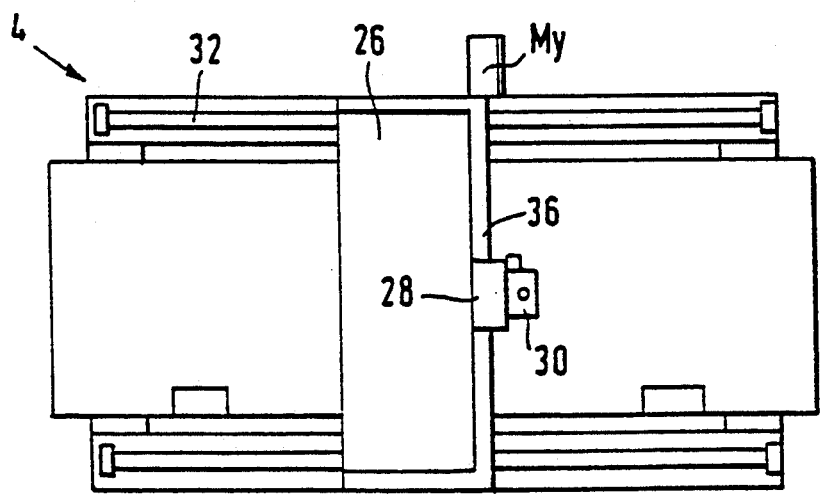

The X-axis carriage 26 is supported by a pair of rails 32 on the opposite sides of table 14, and is selectively positionable with respect to the table by a feed screw 34 driven by an X-motor Mx. The Y-axis carriage 28 is mounted on a rail 36 extending transversely along one side of the X-axis carriage 26, and is selectively positionable along the Y-axis of the table 14 by a Y-axis motor My. The sprayer head 30 is secured to the Y-axis carriage 28 by brackets 38 (FIG. 3a). A third motor, labeled Mz (FIG. 4), is used for driving the feed screw 24 to control the position of the stop roller 28, and thereby of the windshield plate in the coating station, according to the size and configuration of the windshield then being produced.

Sprayer head 30 is supplied with the coating substance from a supply container 40.

It will thus be seen that when a windshield plate WP is in the coating station on the upper face of horizontal table 14, as determined by stop roller 18 (FIG. 4), and is clamped in position by piston 19 pressing the plate against wall 22, sprayer head 30 may be moved to any selected position over the windshield plate by employing the X-axis motor Mx and the Y-axis motor My to spray the coating substance contained within container 40 in any desired pattern over the upper face of the windshield plate. As described above with reference to FIG. 1a, sprayer head 30 is controlled to spray the coating substance in the form of the imprecise border adjacent to and around the outer edge of the windshield plate, as indicated by border CS in FIG. 1a. This painted region CS covers a sufficient amount of the outer edge around the plate to assure that it includes at least the complete surface of the plate to be occupied by the desired border $CS_1$ of FIG. 1b. Accordingly, precise control of the sprayed pattern is not required.

The Radiation-Exposure Machine

Figure 5A:
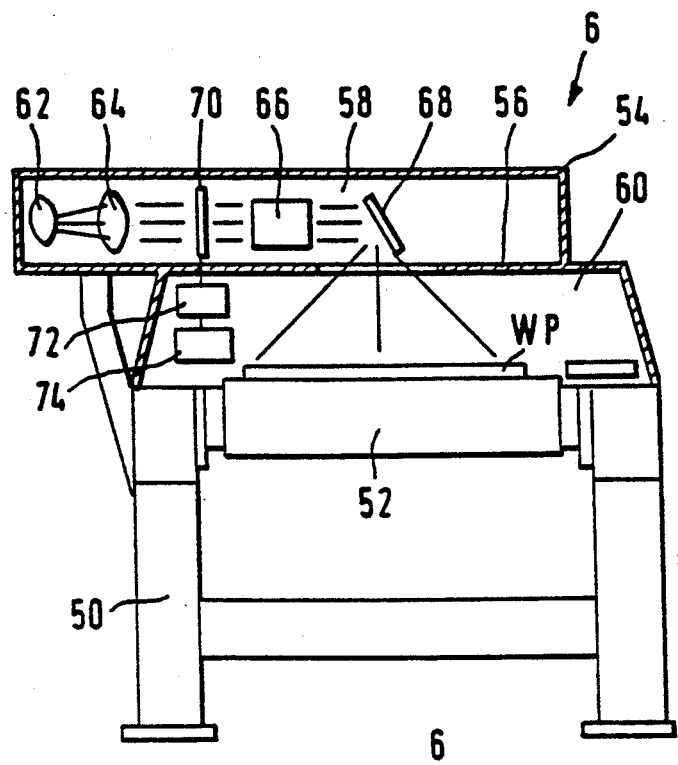
FIGS. 5a and 5b are end and side views respectively, illustrating the radiation-exposing machine in the system of FIG. 2.
Figure 5B:
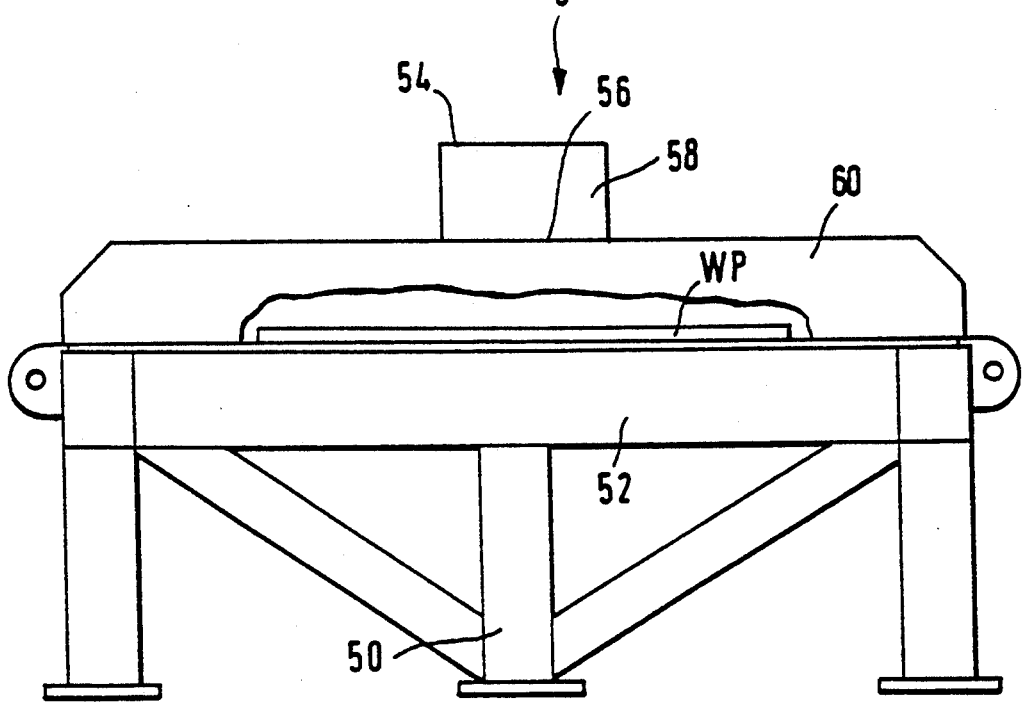

After the imprecise border CS (FIG. 1a) of coating substance has been thus applied to the windshield plate WP in the coating machine 4, the windshield plate is advanced to the radiation-exposure machine 6 illustrated in FIGS. 5a and 5b. Machine 6 exposes the precise surface of the windshield plate to be occupied by the painted border to a specific type of electromagnetic radiation (e.g., ultraviolet or infrared) which causes the coating substance to harden and to bind itself to the windshield plate.

The coating substance may be any one of the known UV curable liquids presently used for painting the black border around the windshield. Its viscosity must be low enough as as to be sprayable, and it should be soluble in a solvent in the liquid state but insoluble in the same solvent in the solid state. Examples of such materials are modified acrylates and materials described in U.S. Pat. No. 4,100,141. A suitable solvent is isopropylene.

Other forms of radiation, other than ultraviolet light, may be used to harden the coating. For example, alphaoctadecylacrylic acid that has been slightly polymerized with ultraviolet light can be polymerized (hardened) with an election beam, and poly(2,3-dichloro-1-propyl acrylate) can be polymerized (hardened) with an X-ray beam.

Radiation machine 6 illustrated in FIGS. 5a and 5b also includes a base 50 supporting a horizontal table 52 adapted to receive the windshield plate WP fed to it from the coating machine 4. The upper face of table 52 of the radiation machine is similarly constructed as the upper face of table 14 of the coating machine, as illustrated in FIG. 4, to include the conveyor belts 16 for conveying the windshield plate over the upper face of the table, the selectively-positionable roller 18 for fixing the position of the windshield plate, and the piston 19 for clamping the windshield plate between it and wall 22 on the opposite side of the table.

The radiation machine illustrated in FIGS. 5a and 5b further includes a housing 54 overlying table 52. Housing 54 is divided by a partition 56 into an upper compartment 58 containing the optical system including the source of the electromagnetic radiation, and a lower compartment 60 closed by table 52 and through which the electromagnetic radiation is directed onto the upper face of the windshield plate WP supported on table 52.

The optical system within compartment 58 includes a source of electromagnetic radiation 62, a collimating lens 64, a lens system 66, and a deflector mirror 68, for deflecting the electromagnetic radiation to the windshield plate WP within compartment 60. A mask 70 is interposed between lenses 64 and 66 and is formed with the precise pattern of the painted border ($CS_1$, FIG. 1b) to be applied to the windshield plate. Thus, mask 70 is transparent to the electromagnetic radiation from source 62 at the portions of the mask corresponding to the precise border $CS_1$ to be applied, and is opaque with respect to the remaining portions. Partition 56 and the side walls of the housing lower compartment 60 shield the windshield plate WP from all extraneous light, i.e., all light except that emanating from the electromagnetic source 62 and passing through mask 70.

Radiation machine 6 illustrated in FIGS. 5a and 5b further includes a holder 72 for holding a plurality of masks 70 having border patterns corresponding to different sizes and configurations of windshield plates that may be processed by the system. Any desired mask may be selected by a selector device, which may be similar to that used in a conventional slide selector and which is schematically indicated at 74, for introduction between the lenses 64 and 66.

Figure 6A:
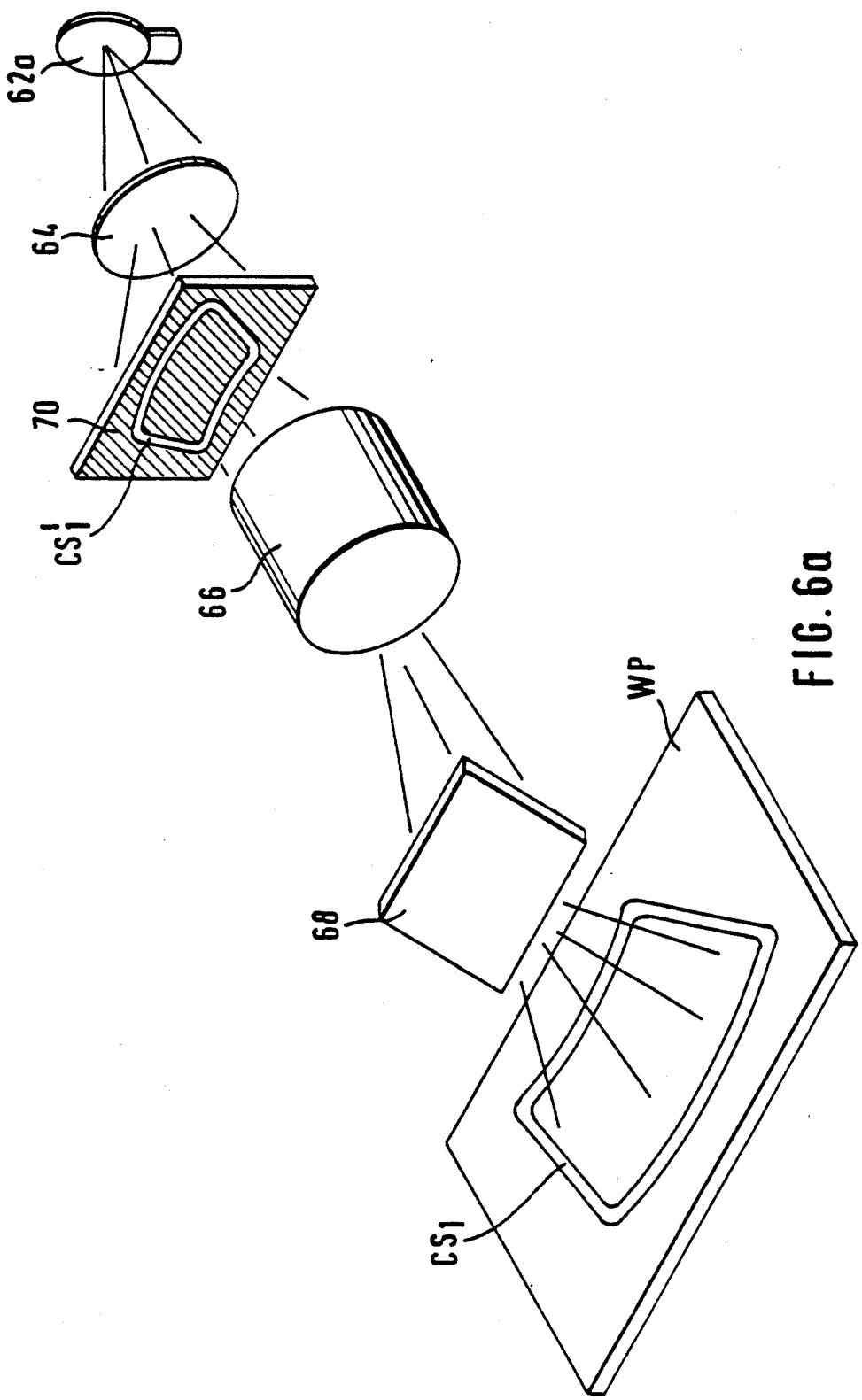
FIGS. 6a, 6b and 6c diagrammatically illustrate different arrangements for making the exposure in the radiation-exposing machine.

The above-described elements in the optical system illustrated in FIG. 5a are more particularly shown in FIG. 6a, wherein it will be seen that electromagnetic radiation, e.g., ultraviolet light, from light source 62a is passed through collimating lens 64, mask 70, and lens system 66 before it is deflected by mirror 68 onto the upper face of the windshield plate WP. The exposure pattern $CS_1$ produced is precisely the transparent portion $CS_1'$ of the mask 70. In this case, the complete exposure pattern is produced in one shot at the time of energization of light source 62a, and therefore the light source should be of high power.

Figure 6B:
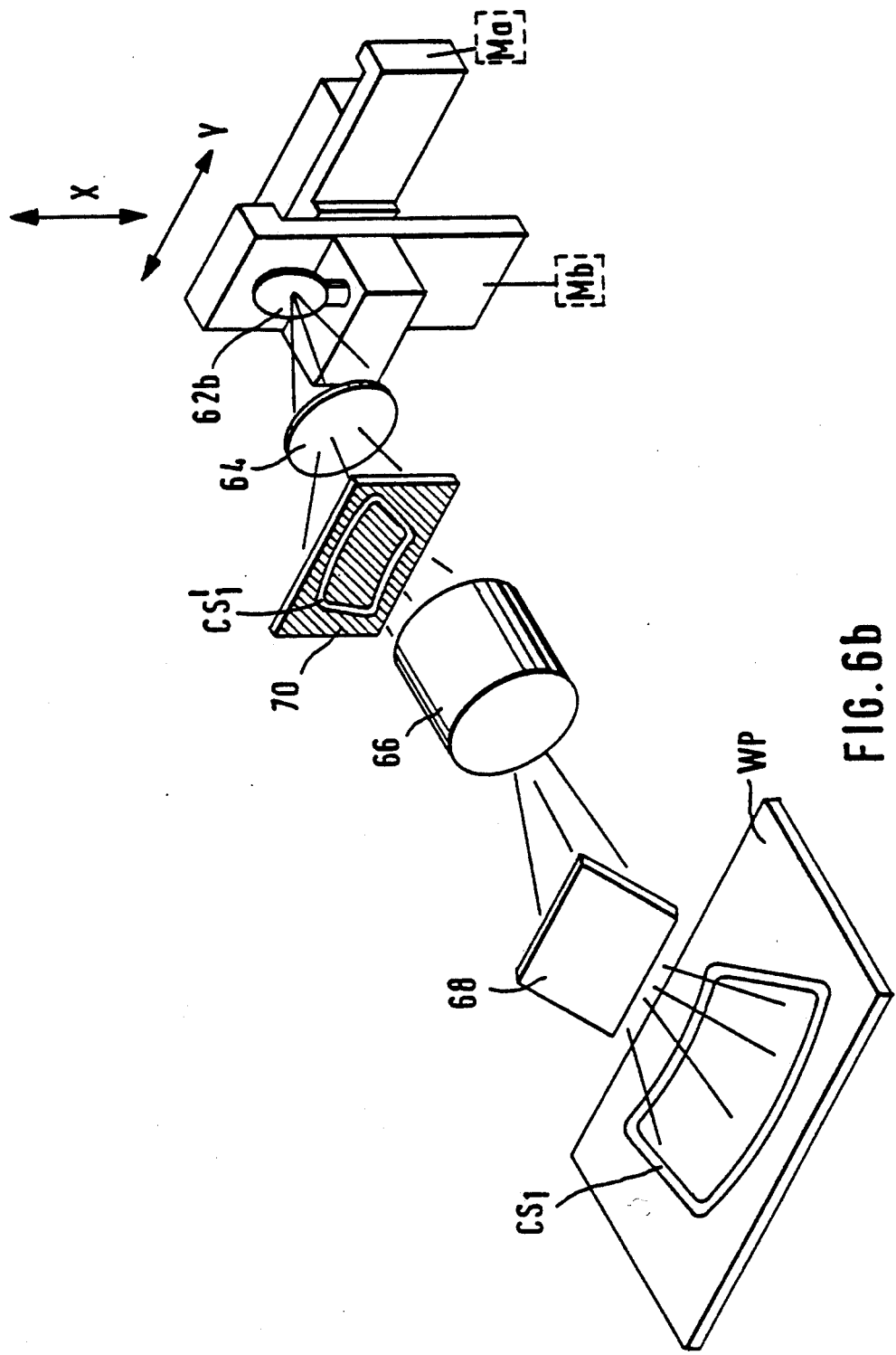

FIG. 6b illustrates another optical system which may be used, wherein the exposure pattern is not produced at one time with the exposure of the light source 62, but rather is produced by moving light source around the exposure pattern $CS_1$ formed in the mask 70, thereby obviating the need for a high-power light source. For this purpose, the light source 62b illustrated in FIG. 6b is mounted for movement along the X-axis by a motor schematically shown at Ma, and also along the Y-axis by another motor schematically shown at Mb. The latter two motors thus control the light source so as to follow the exposure pattern $CS_1'$ in mask 70 in order to trace that exposure pattern on the upper face of the windshield plate WP.

Figure 6C:
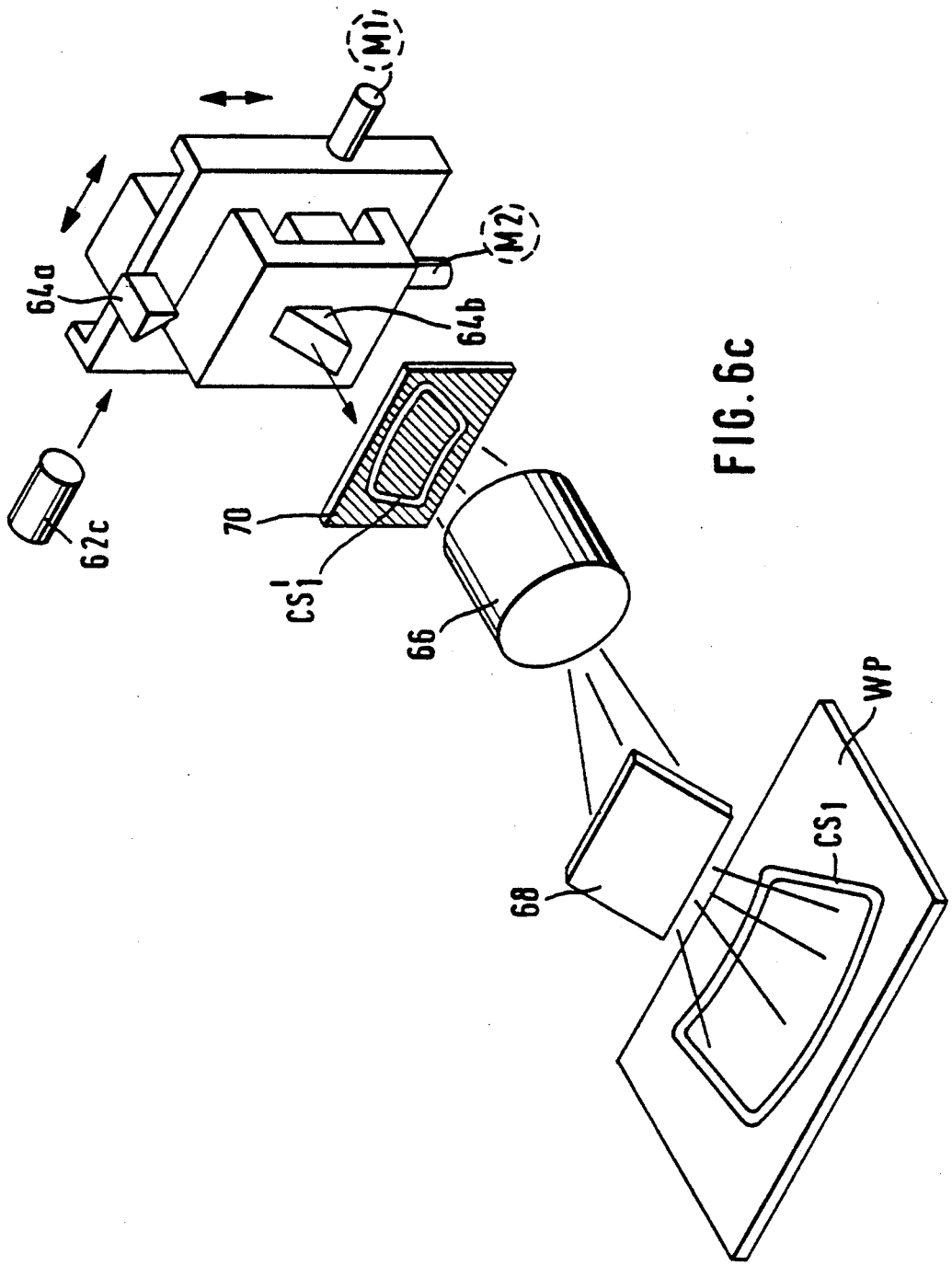

FIG. 6c illustrates another system which may be used for exposing the precise pattern on the windshield plate WP. In this case, the optical source 62c, preferably a laser, produces a beam which is deflected by a pair of mirrors 64a, 64b to trace the pattern $CS_1'$ in the mask 70. The laser beam outputted by laser 62c can thus be deflected along both the X and Y-axes by controlling the deflector mirror 64a, 64b via their drive motors $M_1$, $M_2$.

In both the FIG. 6b arrangement wherein the light source is moved to trace the pattern, and in FIG. 6c where the light beam (e.g., laser beam) is deflected to trace the desired pattern, a relatively wide beam may be used since the pattern is precisely defined by the mask 70. If a narrow-beam light source, particularly a laser beam, is used, mask 70 may be omitted from the arrangements illustrated in both FIGS. 6b and 6c. For example, when using a laser, the laser itself may be driven by the X-Y drive motors Ma, Mb (FIG. 6b), or its beam may be deflected by the mirrors 64a, 64b as controlled by the X-Y motors Ma, Mb, to trace the pattern directly on the face of the windshield plate WP without the use of the mask 70.

The Washing Machine

After the windshield plate has been sprayed with the imprecise pattern CS (FIG. 1a) in the spraying machine 4, and exposed to the precise pattern $CS_1$ (FIG. 1b) in the radiation machine 6, the windshield plate is then fed to the washing machine 8, which washes away the portions of the coated substance $CS_2$ outside of the desired pattern, leaving only the desired pattern $CS_1$ as illustrated in FIG. 1c.

Figure 7A:
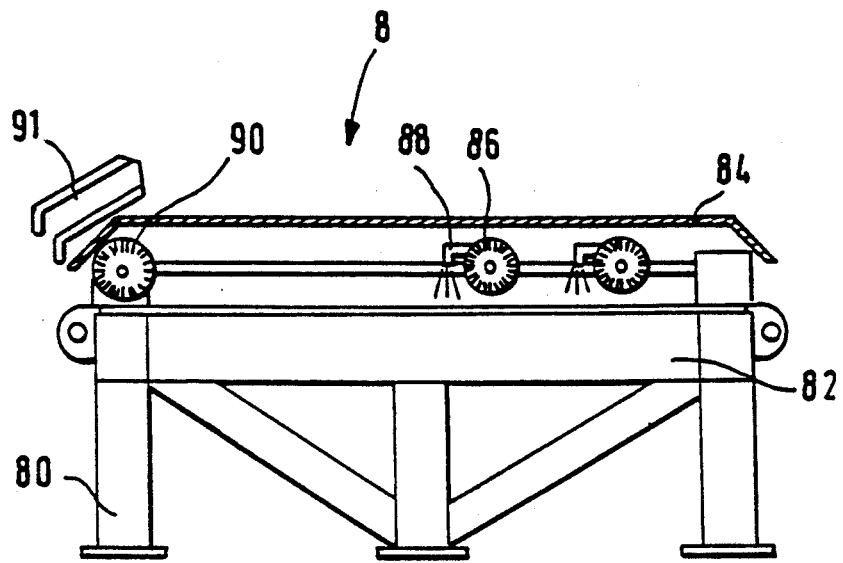
FIGS. 7a and 7b are diagrammatic side and end views, respectively, illustrating the washing machine in the system of FIG. 2.
Figure 7B:
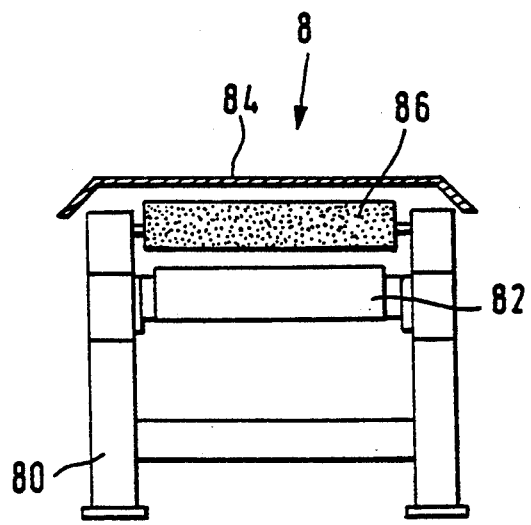

The washing machine 8, as more particularly illustrated in FIGS. 7a and 7b, comprises a base 80 supporting a horizontal table 82 for receiving the windshield plate WP which is moved thereacross by conveyor belts (not shown), similar to the conveyor belts 16 in FIG. 4. The washing machine 8 includes a housing 84 enclosing a plurality of brushes 86 each having a nozzle 88 for spraying the windshield plate with a liquid which is a solvent for the unexposed coated substance, but not for the exposed coated substance. Accordingly, the unexposed coated substance, corresponding to coating portion $CS_2$ in FIG. 1b, will be washed away in the washing apparatus, thereby leaving the coated substance $CS_1$ in the precise desired pattern bonded to the windshield plate.

The outlet end of the washing machine 8 illustrated in FIGS. 7a and 7b includes a wiper roller 90 for wiping the windshield plate before it exits from the machine, and an air dryer 91 which applies warm or hot air to the windshield plate in order to completely dry it as it leaves the washing machine.

The Control Systems

Figure 8:
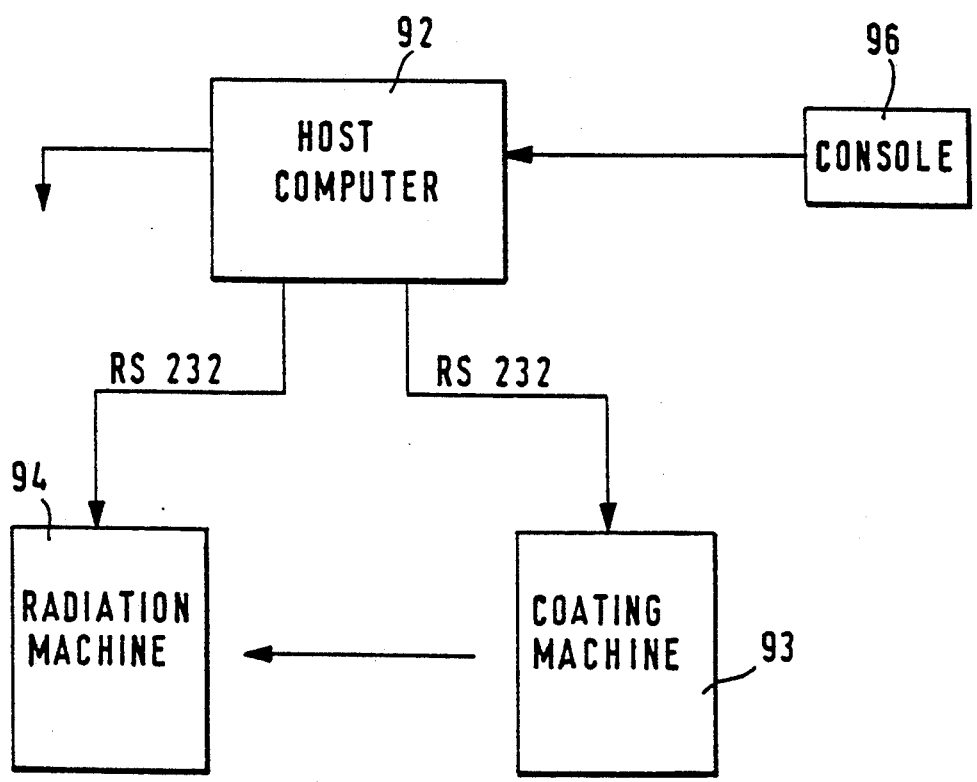
FIG. 8 is a block diagram illustrating the overall automatic control of the system of FIG. 2.

FIG. 8 is a block diagram illustrating the overall control of the coating machine 4 and the radiation machine 6 by a host computer 92. Thus, a computer 93 is provided for the coating machine 4, and another computer 94 is provided for the radiation machine 6. Both computers 93 and 94 may be of a standard type used in CNC (computer numerical control) machines and communicate with the host computer 92 via standard RS 232 busses. The host computer 92 is in turn controlled by a console 96 permitting the appropriate data to be inputted into the host computer according to the size, configuration, and other parameters of the windshield plates to be processed by the system. A special computer is not required for the washing machine, but one may be provided if desired, also controlled by the host computer.

Figure 9:
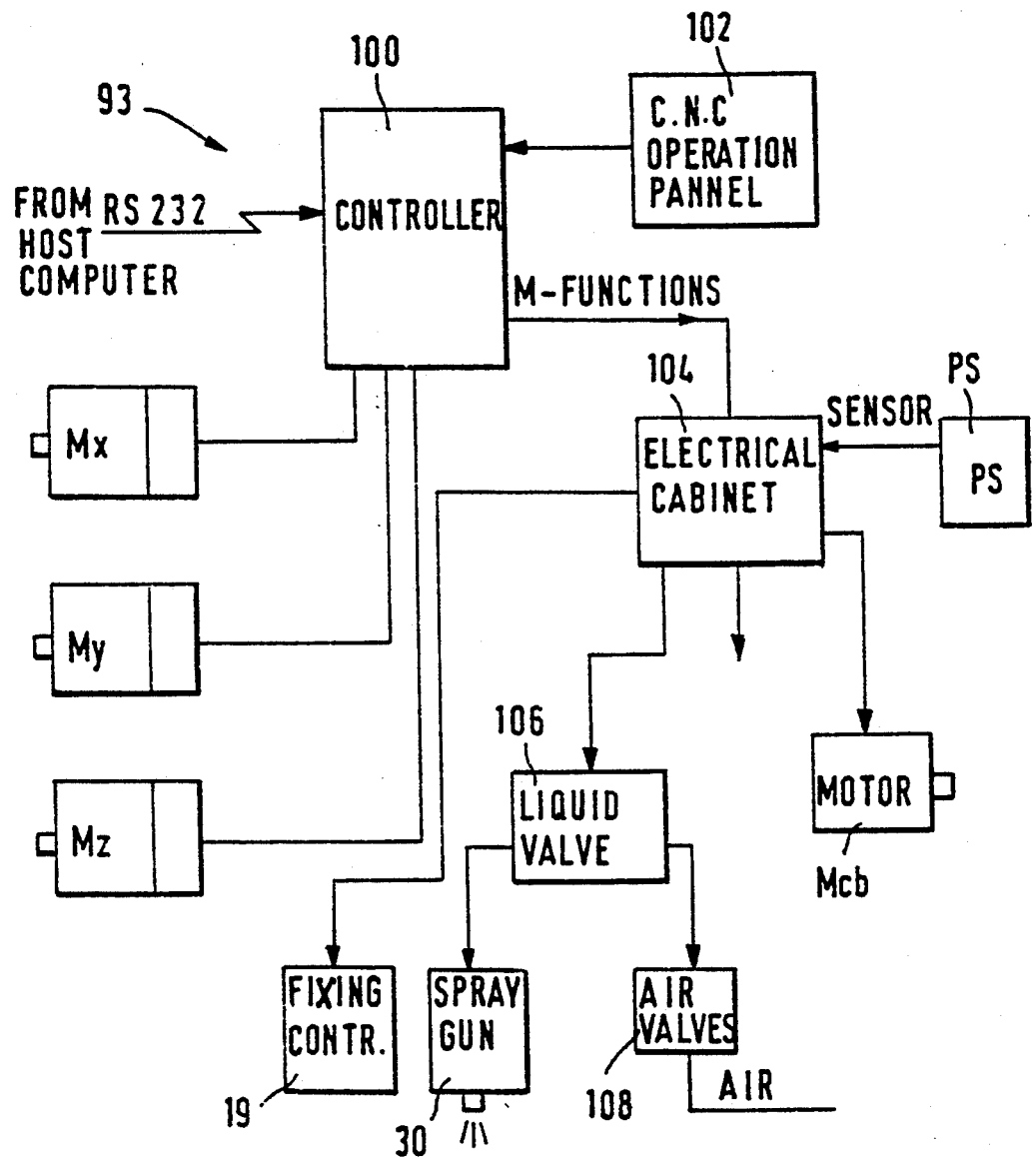
FIG. 9 is a block diagram illustrating the automatic control of the coating machine.
Figure 10:
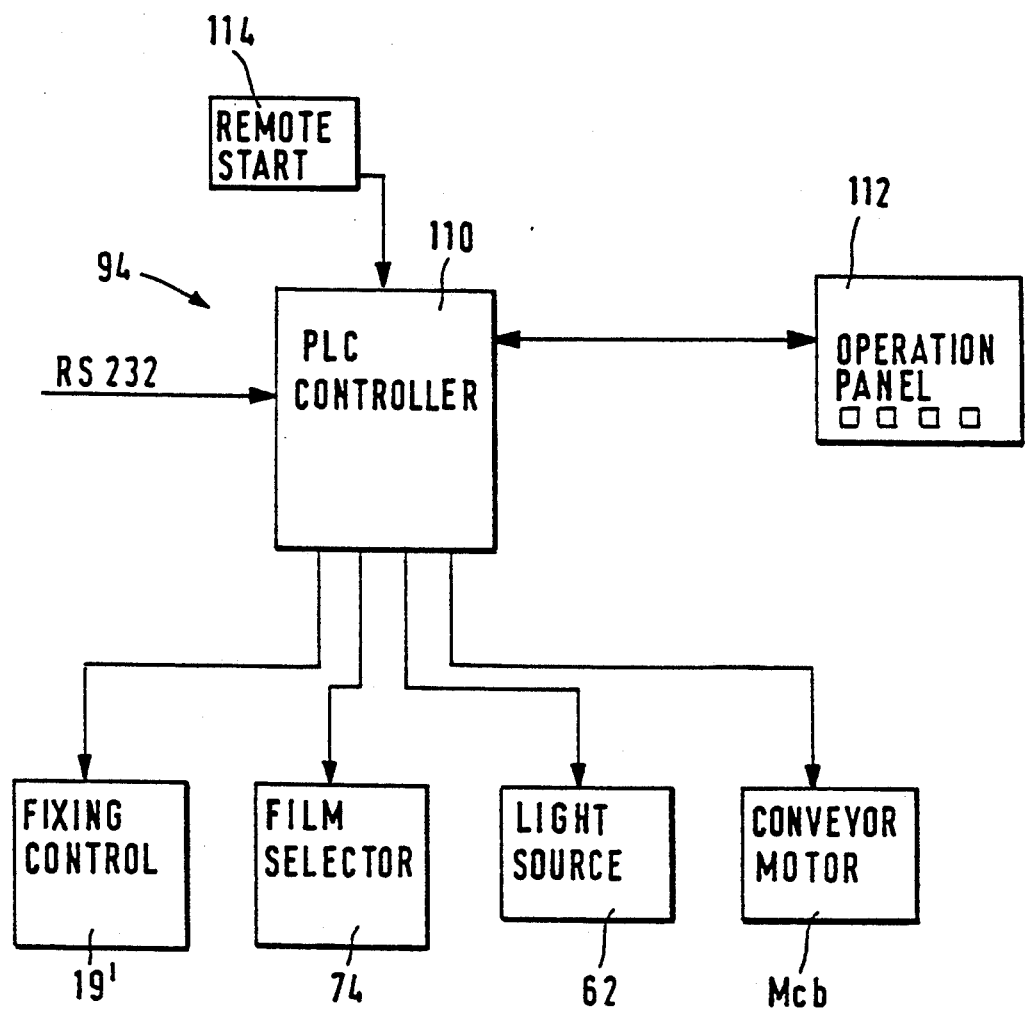
FIG. 10 is a block diagram illustrating the control of the radiation-exposing machine.
Figure 11:
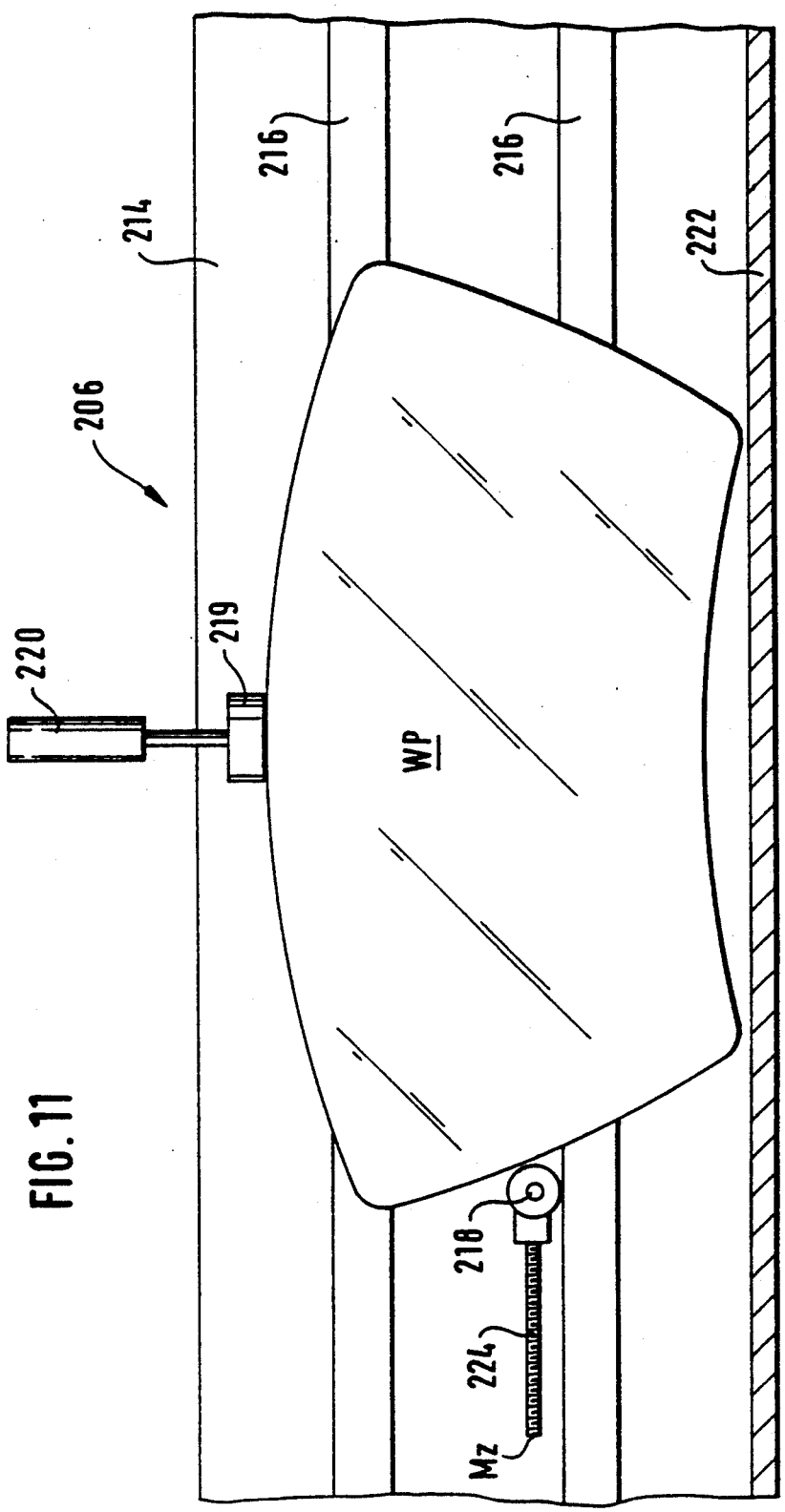
FIG. 11 illustrates a windshield plate mounted on a table in the radiation-exposure apparatus for performing the radiation-exposure operation in the system of FIG. 2.
Figure 12:
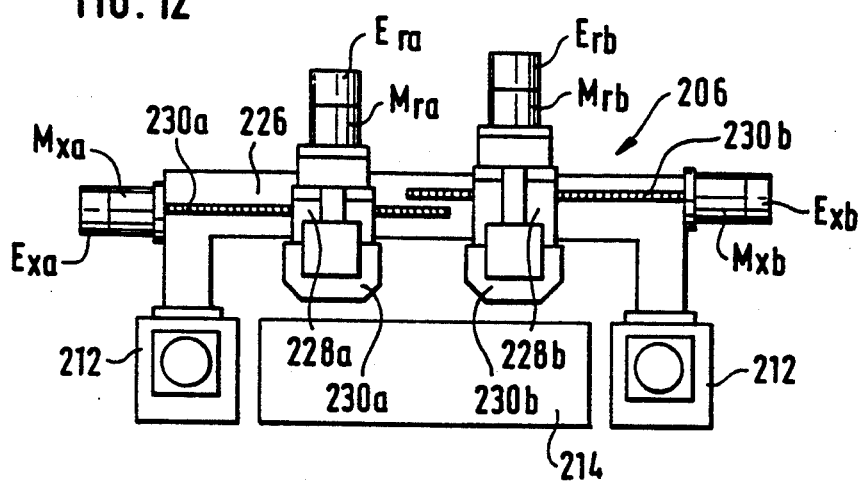
FIGS. 12, 13 and 14, are side, top and end views, respectively, illustrating another form of apparatus for performing the radiation-exposure operation.
Figure 13:
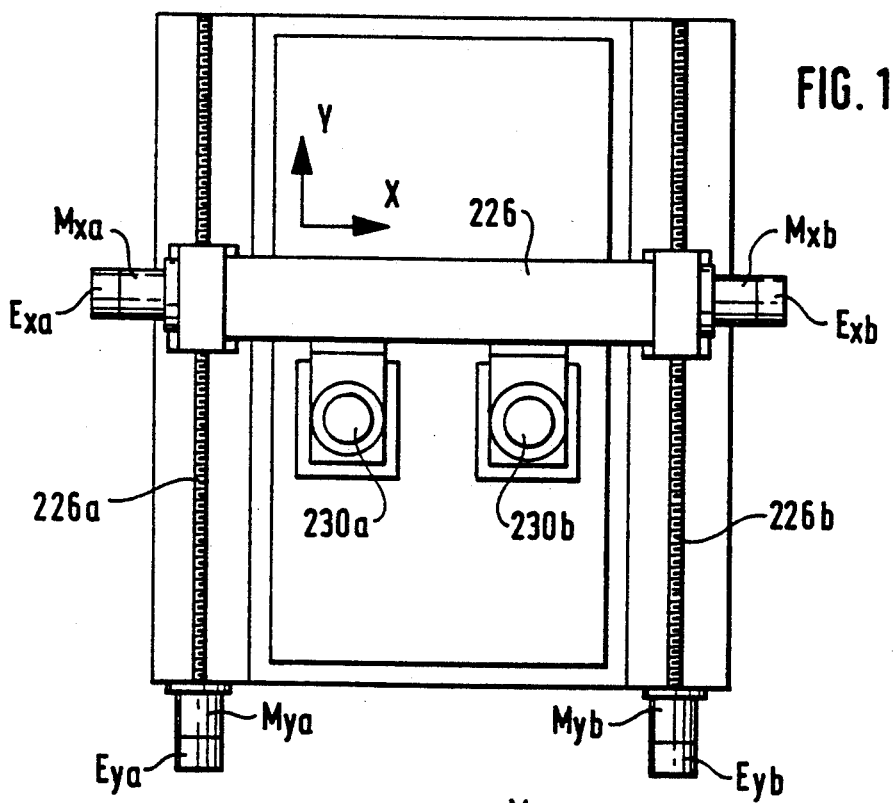
Figure 14:
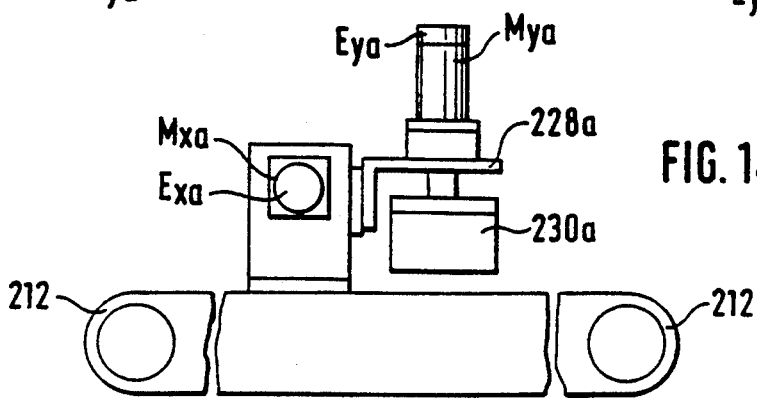

FIG. 9 illustrates the coating machine computer 93, and FIG. 10 illustrates the radiation machine computer 94.

The coating machine computer 93, as illustrated in FIG. 9, comprises a CNC controller 100 having an operation panel 102 and communicating with the host computer via the RS 232 bus. Controller 100 controls motor Mx which drives the X-axis carriage 26, and motor My which drives the Y-axis carriage 28. Controller 100 also controls motor Mz driving roller 18 (FIG. 4), via screw feeder 24, to precisely position the windshield plate WP in the coating section according to the size and configuration of the plates then being processed. The foregoing controls are effected in accordance with the data received from the host computer 92 (FIG. 8) via the RS 232 bus, as well as the data inputted via the operation panel 102 of the coating machine controller 100.

The coating machine controller 100 also controls a number of other operations, called "M-functions". Thus, the controller 100 may control via electrical cabinet 104, the clamping piston 19 for fixing the plate in the coating station, the conveyor belt motor Mcb, a liquid valve 106 controlling the supply of the liquid substance to the sprayer head 30, and an air valve 108 controlling the supply of air to the sprayer head. In addition, the coating apparatus may be provided with a position sensor PS on table 14 for sensing the correct positioning of the windshield plate in the coating station, which sensor feeds a signal to the electrical cabinet 104 causing same to control the conveyor belt motor Mcb.

The computer 94 controlling the radiation machine 6, as illustrated in FIG. 10, also includes a controller 110 having an operation panel 112 and communicating with the host computer via an RS 232 bus. Controller 110 may also have a remote start unit 114. It in turn controls the light source 62, the film selector 74 (FIG. 5a), the motor Mcb driving the conveyor belts in the radiation machine, and the piston 19' (corresponding to piston 19, FIG. 4) for fixing the plate in position in the radiation machine.

Preferably, the above process is performed on one plate, namely the plate to constitute the outer face of the laminated windshield, before the outer plate is laminated to the inner plate.

Improved Radiation Machine

FIGS. 11-17 illustrate an improved radiation machine 206. As in the previous construction, the improved machine also includes a base 212 supporting a horizontal table 214 which receives the windshield plate WP. A pair of conveyor belts 216 (FIG. 11) pass over the upper surface of table 214 to convey each windshield plate to a predetermined position on the table as defined by the position of a roller 218 engageable with the leading edge of the windshield plate. When the windshield plate WP is properly positioned by roller 218, it is clamped in this position between a piston 219 actuated by a cylinder 220, and a wall 222 at the opposite side of the table. Roller 218 is selectively positionable to the proper position, according to the particular size and configuration and windshield plate being processed, by a feed screw 224 driven by a motor $M_Z$.

In the improved machine, a carriage 226 (FIGS. 12-14), in the form of a gantry bridge, is mounted over the upper face of table 214 and is movable along the Y-axis (vertically, FIG. 13) by a pair of lead screws 226a, 226b driven by a pair of motors Mya, Myb, having encoders Eya, Eyb. The Y-carriage 226, in turn, carries two X-carriages 228a, 228b, driven along the X-axis by lead screws 230a, 230b and motors Mxa, Mxb, each having encoders Exa, Exb. Each of the X-carriages 228a, 228b carries a radiation head 230a, 230b.

Figure 15:
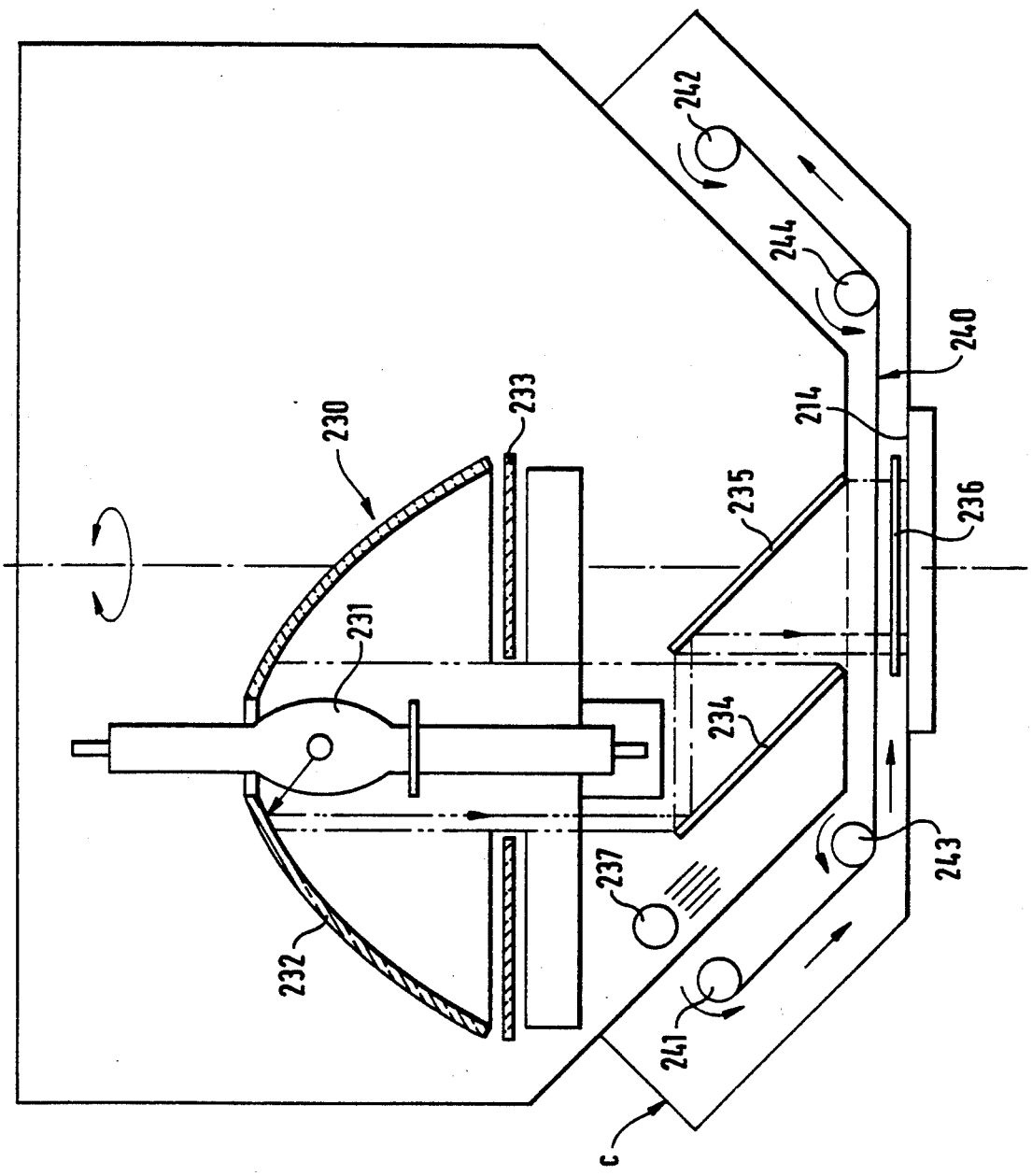
FIG. 15 diagrammatically illustrates one form of radiation head for use in performing the radiation-exposure operation of FIGS. 12-14.

Both heads 230a, 230b are of the same construction as illustrated by head 230 in FIG. 15. Thus, each radiation head includes a radiation source 231 mounted at the focal point of a parabolic reflector 232 so that the radiation is reflected parallel to the optical axis of the radiation head. The radiation is shaped by an aperture plate 233. It is then reflected 90° by a first reflector 234, and a second reflector 235, through a cover plate 236 towards the table 214 carrying the windshield plate WP to be exposed to the radiation.

Radiation source 231 is a source rich in ultraviolet light, but also contains infrared light. Reflector 234 reflects most of the ultraviolet light via reflector 235 towards the windshield plate WP on table 214, whereas most of the infrared light passes through reflector 234 and is dissipated by a fan 237.

Interposed between light source 231, and particularly its reflector 235, and the windshield plate support on table 214, is a mask, generally designated 240, having the final exposure pattern ($CS_1$, FIG. 1) recorded thereon. In this case, the mask is transparent to the ultraviolet radiation at the portions of the coated substance to be hardened and bound to the windshield to produce the final pattern $CS_1$ (FIGS. 1b and 1c), and is opaque to the remaining portions of the pattern corresponding to the portions ($CS_2$) of the coated substance to be removed during the washing operation of unit 8 in FIG. 2.

The mask 240 is in the form of a continuous strip. It is wound between a supply reel 241 and a takeup reel 242 and extends across the output reflector 235 of the radiation head. The pattern is recorded on strip 240 in a progressive manner, as will be described more particularly below with respect to FIG. 17, such that one end of the strip mask 240 records the beginning portion of the pattern, and the opposite end records the end portion of the pattern. The strip mask 240 can be embodied in a cassette, including guide rollers 243, 244, guiding the strip as it is progressively moved across the outlet window 236 of the radiation head 230.

The strip mask 240 is unwound from its supply reel 241 to its takeup reel 242 to progressively expose the pattern recorded thereon over the windshield plate supported on table 214. At the same time, the radiation head 230 is also moved, relative to table 214, such that the portions of the pattern on the strip mask 240 progressively become aligned with their corresponding portions of the windshield plate supported on table 214 to be exposed to the recorded pattern; i.e., there is relative movement between the head and the windshield plate, but no relative movement between the respective portions of the strip mask and the windshield plate, during the radiation exposure.

The two radiation heads 228a, 228b (FIGS. 12-14) are each pivotally mounted about their own longitudinal axis, and each is pivotted by its own rotary motor Mra, Mrb, each having an encoder Era, Erb. The two radiation heads 230a, 230b are thus moved together along the Y-axis by the Y-carriage 226, but each may be moved independently along the X-axis 228a, 228b by its own motor Mxa, Mxb, and may also be pivotted about its own longitudinal axis by its individual motor Mra, Mrb.

The radiation unit 206 is operated in the following manner:

After the windshield plate WP has been coated in the coating unit 4 (FIG. 2) around its outer edge, producing the initial imprecise coating CS in FIG. 1a, the windshield is conveyed to the radiation unit 206 by the conveyor belt 216. There it is located in proper position on table 214 by motor 218 and is clamped in position by piston 219.

Each of the radiation heads 230a, 230b had been previously loaded with a mask in the form of a continuous strip 240 contained in a cassette received by the respective radiation head. Each radiation head acts only on one-half the periphery of the windshield plate WP, and therefore the strip mask of each cassette has recorded thereon only one-half the pattern to be applied to the windshield plate.

Figure 16:
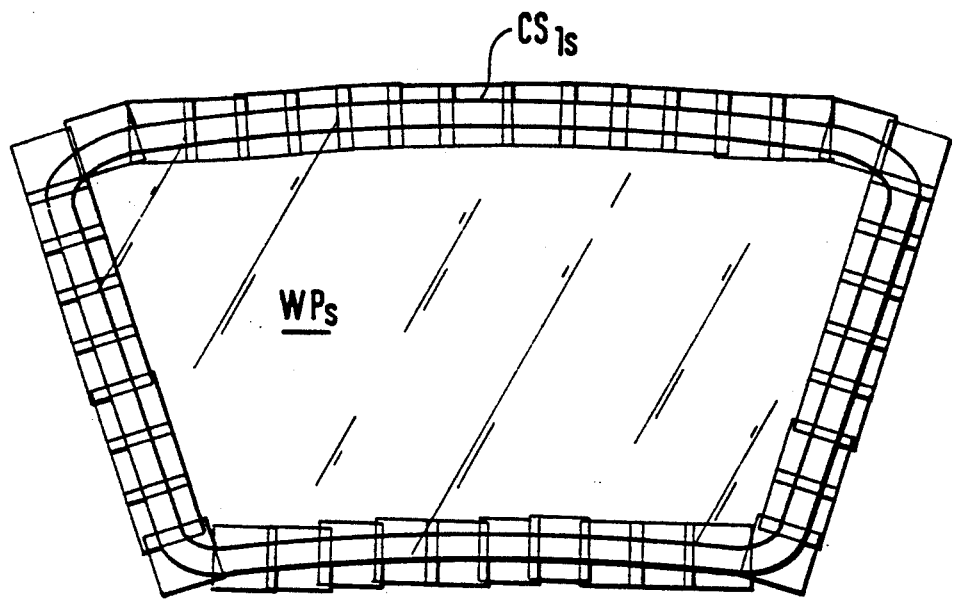
FIG. 16 illustrates how the windshield plate is divided into a plurality of rectilinear scanninglines for performing the radiation-exposure operation of FIGS. 12-14.

As shown in FIG. 16, the two radiation heads 230a, 230b are both located at the start point S, and are moved in opposite directions along the X-axis, but in the same direction along the Y-axis, to scan the respective half of the outer periphery of the windshield plate WP, until they both arrive at the end point E, at which time the two heads will have scanned the complete outer periphery of the windshield plate.

As also shown in FIG. 16, the two radiation heads are moved along rectilinear scanning lines. Each scanning line is of sufficient width and length so as to scan the respective portion of the windshield plate WP to be occupied by the final pattern $CS_1$. At the beginning of each rectilinear scan line, the radiation heads 230a, 230b are pivotted about their longitudinal axes by their rotary motors Mra, Mrb, to assure that the rectilinear line to be scanned will cover the final pattern $CS_1$ for the respective portion of the periphery of the windshield plate.

Thus, at the start of the exposure operation, the two radiation heads 230a, 230b are located at opposite sides of the starting point S in FIG. 16, at the beginning of the first scanning line $SL_{a1}$, $SL_{b1}$. Then both heads are moved in opposite directions to the ends of their respective scanning lines. As the two heads are thus moved relative to the windshield plate supported on table 214, the strip masks 240 in the two heads are operated to progressively align the portions of the patterns recorded thereon with their respective portions of the windshield plate, so that there is no relative movement between the masks and the windshield plate at the time of the exposure. That is to say, the strip masks 240 are effectively "rolled onto" the surface of the windshield plate as their radiation heads 230 traverse their respective scanning lines along the outer circumference of the windshield plate.

As soon as one scanning line has been completed, e.g., scanning lines $SL_{a1}$, $SL_{b1}$, the radiation heads are pivotted, if necessary, about their respective longitudinal axes by their motors $M_{ra}$, $M_{rb}$ before starting the next scanning line (e.g., $SL_{a2}$, $SL_{b2}$), to assure that in their complete traverses of the next scanning lines they will expose the pertinent portions of the final patters $CS_1$ of coating substance to be fixed to the windshield.

Figure 17:
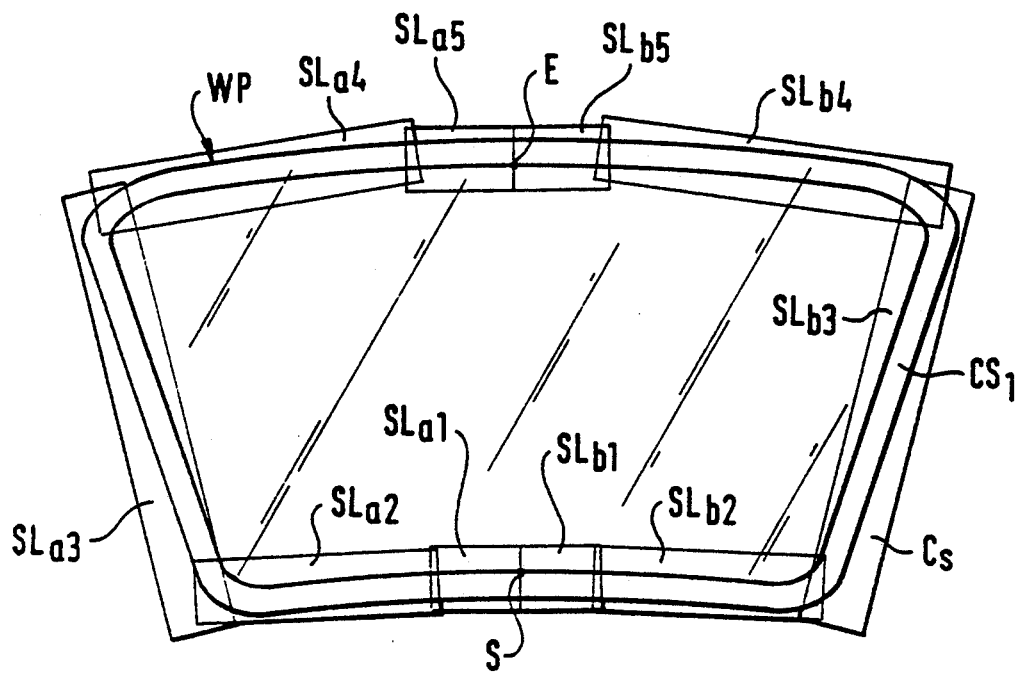
FIG. 17 diagrammatically illustrates how a continuous strip mask may be produced for performing the radiation-exposure operation of FIGS. 12-14.

FIG. 17 illustrates one way of producing the continuous strip masks from a standard windshield plate WP having the desired final pattern $CS_1$ recorded thereon. Thus, a camera loaded with film, e.g., 70 mm, is moved in 70 mm increments around the outer periphery of the standard windshield plate $WP_S$, and, at each such increment, exposes 70 mm of the standard pattern $CS_1$. The standard pattern is thus recorded in increments in a continuous strip of film. Two such cameras can be used, each corresponding to one of the radiation heads 230a, 230b, for recording the strip film of the respective head. Alternatively, the recording process can be done by one camera, in which case the resulting film would be divided into two sections, one for each of the radiation heads.

The method and apparatus described in FIGS. 11-17 are capable of producing very high intensity light exposure with commercially available and relatively inexpensive radiation sources. For example, the radiation heads included in the described apparatus may use standard 1,500 watt Hg-Xe lamps. The described arrangement also provides a compact radiation head which incorporates its respective mask, and which mask can be conveniently changed by merely changing cassettes. Further, by using two such heads the required time of exposure is substantially halved.

While the invention has been described with respect to several preferred embodiments, it will be appreciated that many other variations, modifications and applications of the invention may be made.

What is claimed is:

1. A method of exposing a substrate of relatively large surface area to radiation according to a predetermined pattern recorded on a mask, comprising:
   progressively recording said predetermined pattern on a mask in the form of a continuous strip;
   supporting said continuous strip mask between a source of the radiation and the substrate;
   and moving said radiation source and said continuous strip mask relative to said substrate to progressively scan the surface of the substrate with radiation, while at the same time moving said continuous strip mask relative to said radiation source, said continuous strip mask being progressively wound onto a take-up reel during the progressive scanning of the substrate with radiation, such that portions of the pattern on the continuous strip mask progressively become aligned with their corresponding portions of the substrate as the substrate is progressively scanned by the radiation source; said radiation source and continuous strip mask being carried by a common head which is pivotally mounted about an axis perpendicular to the surface of the substrate to be exposed; said head being moved in a plurality of rectilinear scanning lines while the head is fixed about its pivotal axis for each such scanning line, the head being pivoted before starting a scanning line where the respective scanning line requires a different orientation of the head than the preceding scanning line.

2. The method according to claim 1, wherein there are two of said heads located on the opposite sides of said substrate, said heads being simultaneously operated and controlled such that each head exposes one side of the substrate with one half of the predetermined pattern.

3. The method according to claim 1, wherein said mask is transparent to the electromagnetic radiation at the portions thereof to contain the pattern.

4. The method according to claim 1, wherein said radiation is ultraviolet light from a radiation source radiating both ultraviolet light and infrared light, said radiation being directed to a selective reflector which passes substantially only said ultraviolet light to said continuous strip mask.

5. A method of applying a marking to an automobile glass plate, comprising the following operations:
   (a) coating the surface of the automobile glass plate with an initial pattern, to include the precise surface to be occupied by a final predetermined pattern, with a liquid substance which, when subjected to a predetermined type of electromagnetic radiation, hardens and binds itself to the automobile glass plate;
   (b) exposing the precise surface of the coated substance to be occupied by said final predetermined pattern to said predetermined type of electromagnetic radiation to cause said coated substance to harden and to bind itself to the automobile glass plate; and
   (c) removing the portions of said coated substance not exposed to said electromagnetic radiation;
   characterized in that operation (b) is performed by:
   (1) progressively recording said predetermined pattern on a mask in the form of a continuous strip;
   (2) supporting said continuous strip mask between a source of the radiation and the automobile glass plate;
   (3) and effecting relative movement between said radiation source and said automobile glass plate to progressively scan the surface of the automobile glass plate with radiation, while at the same time moving said continuous strip mask relative to said radiation source, such that portions of the pattern on the continuous strip mask progressively become aligned with their corresponding portions of the automobile glass plate as it is progressively scanned by the radiation source.

6. The method according to claim 5, wherein said automobile glass plate is a windshield, and said final predetermined pattern is an opaque coating applied to the border around the periphery of the windshield.

7. Apparatus for exposing an automobile windshield of relatively large surface area to radiation according to a predetermined pattern recorded on a mask, comprising:
   a source of radiation;
   a mask in the form of a continuous strip having said predetermined pattern progressively recorded thereon;
   means for supporting said continuous strip mask between said source of radiation and the windshield;
   and means for effecting relative movement between said radiation source and said windshield to progressively scan the surface of the windshield with radiation via said mask, while at the same time moving said continuous strip mask relative to said radiation source, such that portions of the pattern on the continuous strip mask progressively become aligned with their corresponding portions of the windshield as the windshield is progressively scanned by the radiation source.

8. The apparatus according to claim 7, wherein said windshield is supported on a fixed support, and said radiation source is moved relative to said windshield during the scanning thereof.

9. The apparatus according to claim 8, wherein said continuous strip mask is carried by said radiation source.

10. The apparatus according to claim 9, wherein said continuous strip mask is initially wound on a supply reel and is progressively transferred to a take-up reel during the progressive scanning of the windshield with radiation.

11. The apparatus according to claim 10, wherein said radiation source and continuous strip mask are carried by a common head.

12. The apparatus according to claim 11, wherein said head is pivotally mounted about an axis perpendicular to the surface of the windshield to be exposed; said apparatus further including drive means for driving said head along a plurality of rectilinear scanning lines, and pivot means for pivotting the head before starting a scanning line where the respective scanning line requires a different orientation of the head than the preceding scanning line.

13. The apparatus according to claim 12, wherein there are two of said heads located on the opposite sides of said windshield and are simultaneously operated and controlled such that each head exposes one side of the windshield with one half of the predetermined pattern.

14. The apparatus according to claim 7, wherein said mask is transparent to the electromagnetic radiation at the portions thereof to contain the pattern.

15. The apparatus according to claim 7, wherein said radiation is ultraviolet light from a radiation source radiating both ultraviolet light and infrared light, said radiation being directed to a selective reflector which passes substantially only said ultraviolet light to said continuous strip mask.

16. A system for applying a marking to an automobile glass plate, comprising:
 (a) means for coating the surface of the automobile glass plate with an initial pattern, to include the precise surface to be occupied by a final predetermined pattern, with a liquid substance which, when subjected to a predetermined type of electromagnetic radiation, hardens and binds itself to the automobile glass plate;
 (b) means for exposing the precise surface of the coated substance to be occupied by said final predetermined pattern to said predetermined type of electromagnetic radiation to cause said coated substance to harden and to bind itself to the automobile glass plate; and
 (c) means for removing the portions of said coated substance not exposed to said electromagnetic radiation;
characterized in that means (b) includes:
 (1) a source of radiation;
 (2) a mask in the form of a continuous strip having said predetermined pattern progressively recorded thereon;
 (3) means for supporting said continuous strip mask between said source of radiation and the automobile glass plate;
 (4) and means for effecting relative movement between said radiation source and said automobile glass plate to progressively scan the surface of the automobile glass plate with radiation via said mask, while at the same time moving said continuous strip mask relative to said radiation source, such that portions of the pattern on the continuous strip mask progressively become aligned with their corresponding portions of the automobile glass plate as the automobile glass plate is progressively scanned by the radiation source.

* * * * *